(12) United States Patent
Feng

(10) Patent No.: US 7,229,846 B2
(45) Date of Patent: Jun. 12, 2007

(54) SEMICONDUCTOR PACKAGE HAVING AN OPTICAL DEVICE AND A METHOD OF MAKING THE SAME

(75) Inventor: Yao-Hsin Feng, Kaoshiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/363,197

(22) Filed: Feb. 28, 2006

(65) Prior Publication Data
US 2006/0199374 A1  Sep. 7, 2006

(30) Foreign Application Priority Data
Mar. 1, 2005  (TW)  .............................. 94106107 A

(51) Int. Cl.
*H01L 21/00* (2006.01)
(52) U.S. Cl. ......................................... 438/26; 438/459
(58) Field of Classification Search .................. 438/33, 438/26, 459, 460–465, 458, 113, 464
See application file for complete search history.

(56) References Cited

U.S. PATENT DOCUMENTS

| 6,040,235 A | 3/2000 | Badehi |
| 6,271,469 B1 | 8/2001 | Ma et al. |
| 6,624,003 B1* | 9/2003 | Rice .............................. 438/106 |
| 6,781,244 B2* | 8/2004 | Prabhu ........................ 257/778 |
| 6,809,008 B1* | 10/2004 | Holm et al. ................. 438/455 |
| 6,891,242 B2* | 5/2005 | Gidon et al. ................. 257/443 |
| 2004/0057649 A1* | 3/2004 | Towle ........................... 385/14 |
| 2004/0229405 A1* | 11/2004 | Prabhu ........................ 438/123 |

* cited by examiner

*Primary Examiner*—Mary Wilczewski
*Assistant Examiner*—Seth Barnes
(74) *Attorney, Agent, or Firm*—Volentine & Whitt, P.L.L.C.

(57) ABSTRACT

The present invention relates to a semiconductor package having an optical device and a method of making the same. The package comprises a chip, an upper metal redistribution layer, a transparent insulating layer, and a lower metal redistribution layer. The chip has an active surface, a back surface, at least one through hole, an optical device, and at least one upper pad, wherein the optical device is electrically connected to the upper pad, and the through hole is filled with a metal post. An insulating layer is disposed between the wall of the through hole and the metal post. The upper metal redistribution layer is disposed on the active surface of the chip, and is used for connecting the upper pad and the metal post. The transparent insulating layer is disposed on the active surface of the wafer. The lower metal redistribution layer is disposed on the back surface of the chip, and is connected to the metal post. Whereby, the optical device is packaged, and the manufacturing process is simplified, and the cost is reduced.

18 Claims, 12 Drawing Sheets

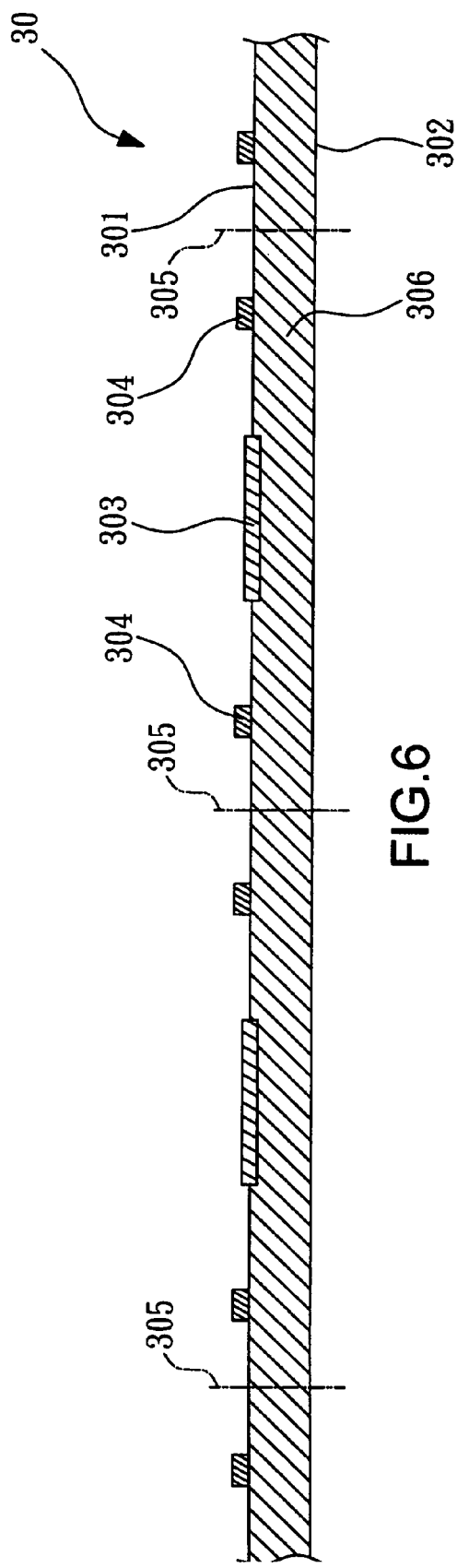
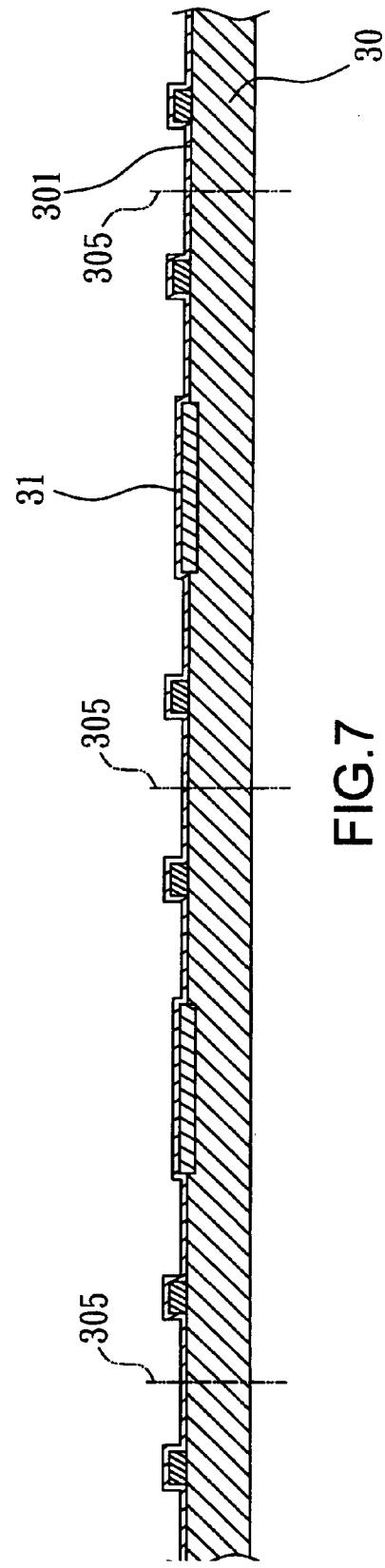
FIG.6
FIG.7

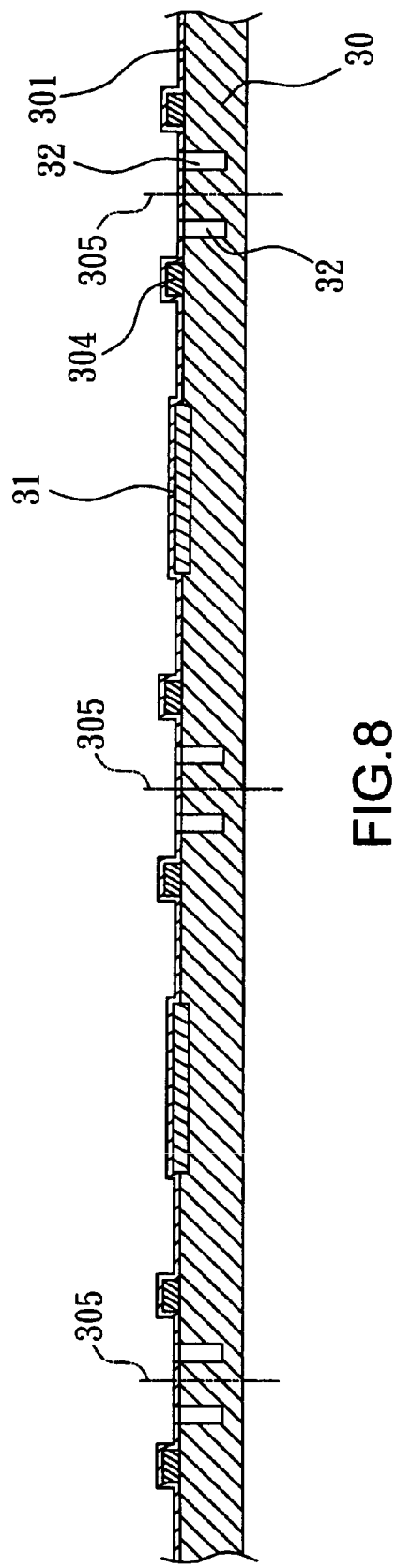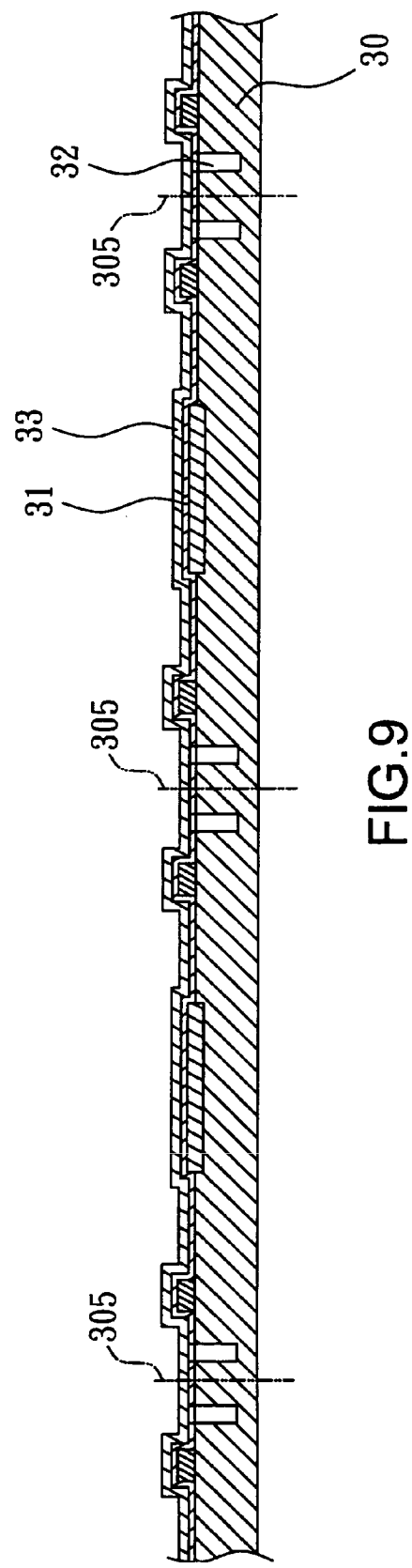

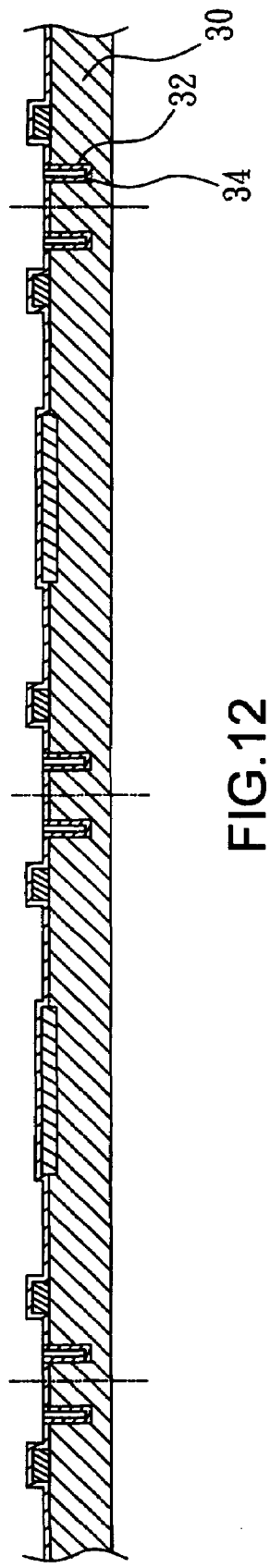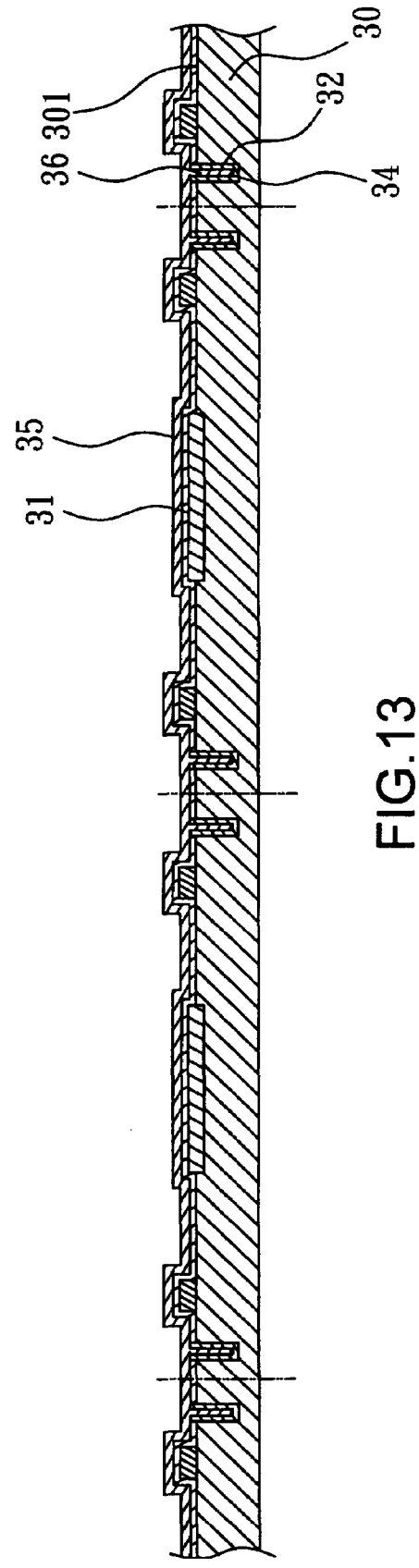
FIG.12
FIG.13

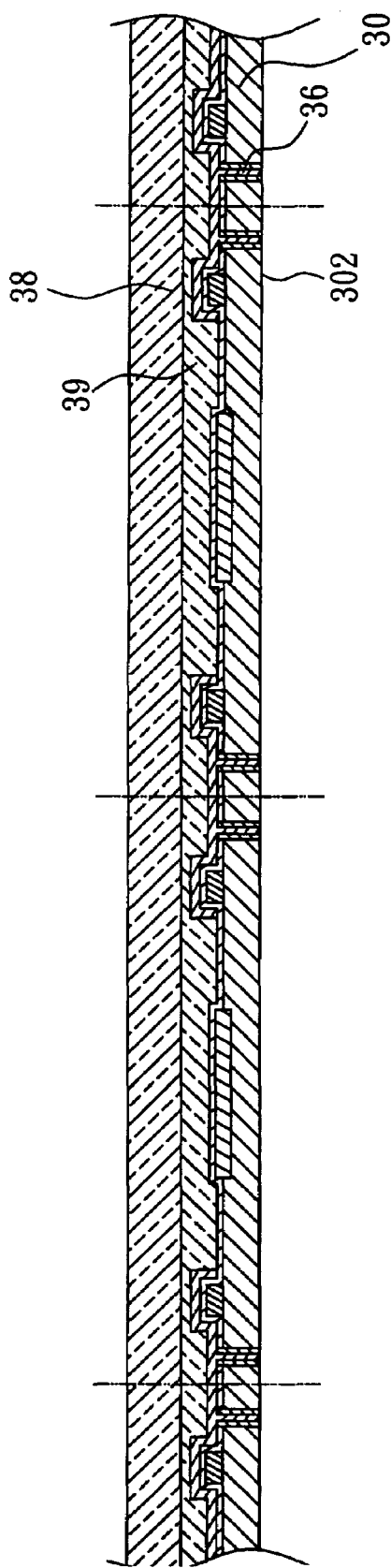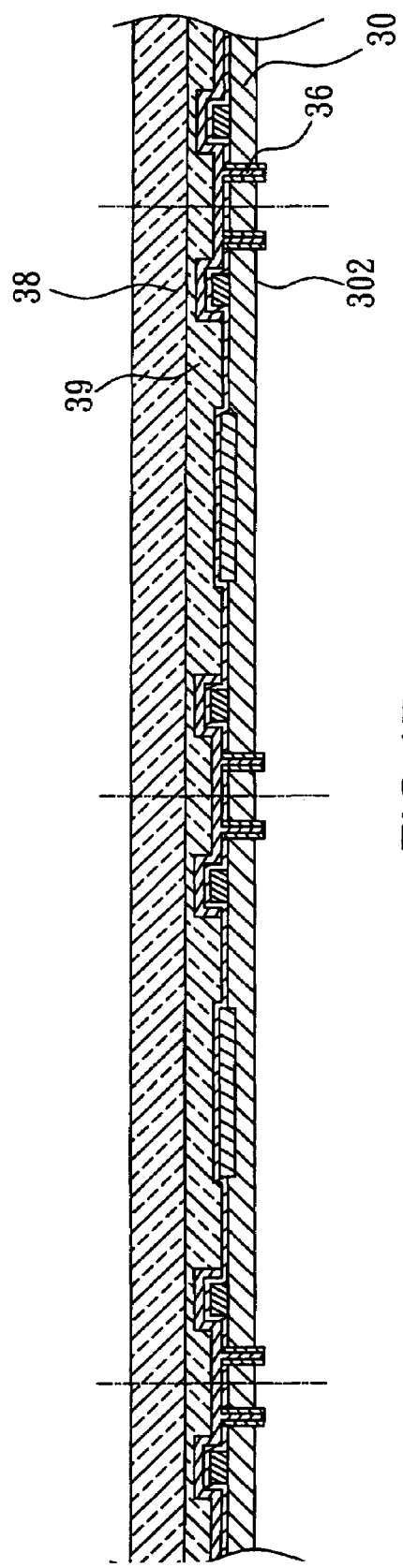

SEMICONDUCTOR PACKAGE HAVING AN OPTICAL DEVICE AND A METHOD OF MAKING THE SAME

BACKGROUND OF THE INVENTION

1. Field of the Invention

The invention relates to a semiconductor package and a method of making the same, and more particularly, to a semiconductor package having an optical device and a method of making the same.

2. Description of the Related Art

Referring to FIGS. 1 and 2, a conventional package and a conventional method of making the same are disclosed in U.S. Pat. No. 6,040,235. The conventional method of packaging the package 10 is described as follows. Firstly, an insulating material 11 is attached to the active surface of a wafer. Then, the wafer is sawed into a plurality of dies 12 and the pads 13 are exposed on the active surfaces of the dies 12. Then, a plurality of electrical contacts 16 are formed after two insulating layers 14, 15 are formed on the lower surface of the dies 12. One end of each of the electrical contacts 16 is connected to the pad 13, and each electrical contact 16 extends to the upper surface 112 of the insulating material 11 along the side surface 111 of the insulating material 11. Finally, the insulating layers 14, 15 are sawed along a sawing line 17 to form the package 10.

Referring to FIGS. 3 and 4, a conventional packaging method is disclosed in U.S. Pat. No. 6,271,469, which is described as follows. Firstly, a chip 20 with its passive surface 21 facing downward is placed in an opening 23 of a colloid 22, and a plurality of pads 24 are exposed on the active surface. Then, a first insulating layer 26 is formed on the active surface, and a plurality of openings 27 are formed on the first insulating layer 26 for exposing the pads 24 (as shown in FIG. 3). Then, a metal circuit 28 is formed on the first insulating layer 26, wherein the metal circuit 28 is electrically connected to the pads 24 through the openings 27. Finally, a second insulating layer 29 is formed on the first insulating layer 26 and the metal circuit 28. Thereby, a package without bumps is formed. However, in the case that the chip 20 is an optical device, its active surface must be capable of receiving light, and the technology disclosed in the patent is not suitable for packaging an optical device. Therefore, the field of application is limited.

Therefore, it is necessary to provide a semiconductor package having an optical device and a method of making the same to solve the above problems.

SUMMARY OF THE INVENTION

The objective of the invention is to provide a semiconductor package having an optical device and a method of making the same, which is suitable for packaging an optical device. The process of the method is simple and cost-saving.

In order to achieve the above purpose, the invention provides a method of packaging a semiconductor package having an optical device, which includes:

(a) providing a wafer having an active surface and a back surface, wherein the active surface has at least one upper pad and an optical device electrically connected to the upper pad;

(b) forming at least one hole on the active surface of the wafer;

(c) forming an insulating layer on the wall of the hole;

(d) forming an upper metal layer on the active surface of the wafer, wherein the hole is filled with the metal layer;

(e) patterning the upper metal layer to form an upper metal redistribution layer, for electrically connecting the upper pad to the metal within the hole;

(f) attaching a transparent insulating layer on the active surface of the wafer;

(g) removing a part of the back surface of the wafer for exposing the metal in the hole to the back surface of the wafer;

(h) forming a lower metal redistribution layer, which is electrically connected to the metal in the hole, on the back surface of the wafer; and (i) sawing the wafer to form a plurality of individual semiconductor packages.

The invention further provides a semiconductor package having an optical device. The semiconductor package comprises a chip, an upper metal redistribution layer, a transparent insulating layer, and a lower metal redistribution layer. The chip has an active surface, a back surface, and at least one through hole. The active surface has at least one upper pad and an optical device electrically connected to the upper pad. The through hole is filled with a metal post and an insulating layer is disposed between the wall of the through hole and the metal post. The upper metal redistribution layer is disposed on the active surface of the chip and connects the upper pad and the metal post. The transparent insulating layer is disposed on the active surface of the wafer. The lower metal redistribution layer is disposed on the back surface of the wafer and electrically connected to the metal post.

BRIEF DESCRIPTION OF THE DRAWINGS

FIGS. 6 to 23 are schematic views corresponding to the steps in FIG. 5.

DETAILED DESCRIPTION OF THE INVENTION

Figure 1:
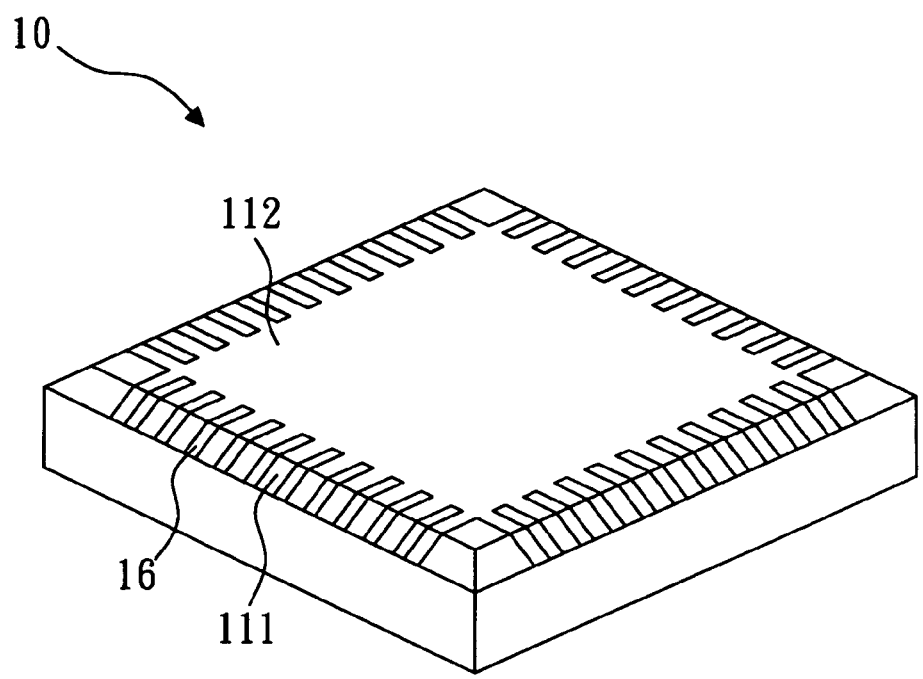
FIGS. 1 and 2 show the package and the method of making the same disclosed in U.S. Pat. No. 6,040,235.
Figure 2:
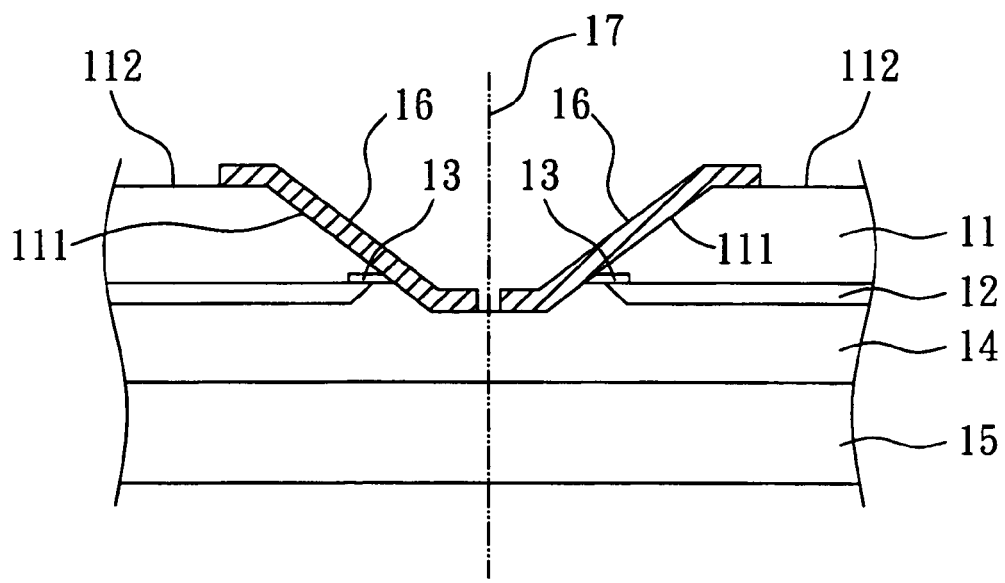
Figure 3:
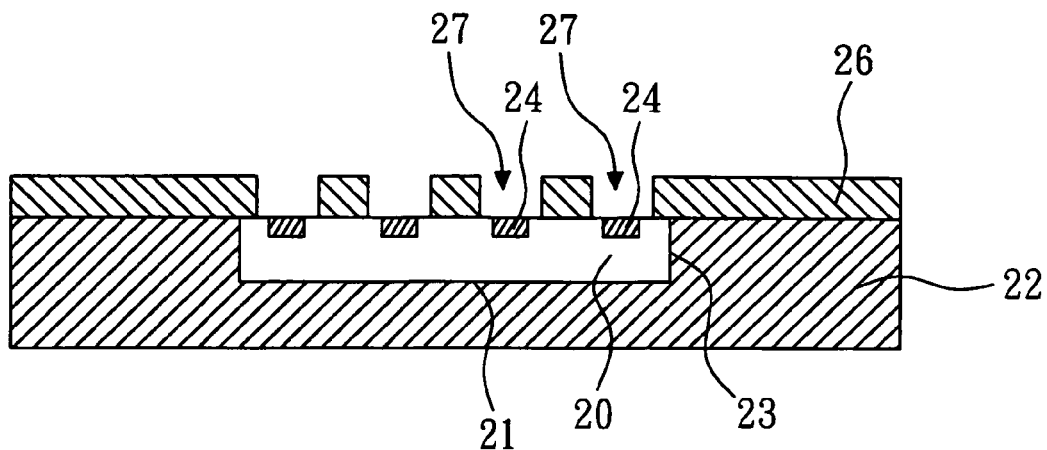
FIGS. 3 and 4 show the packaging method disclosed in U.S. Pat. No. 6,271,469.
Figure 4:
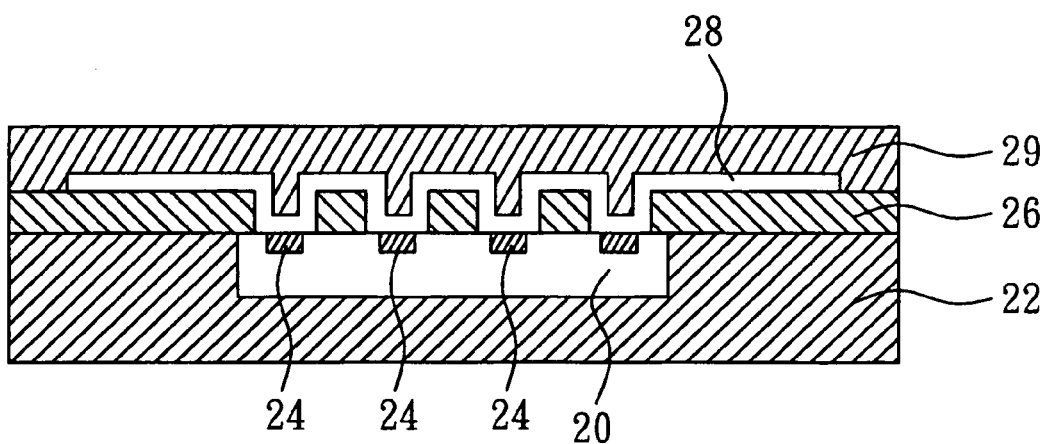
Figure 5:
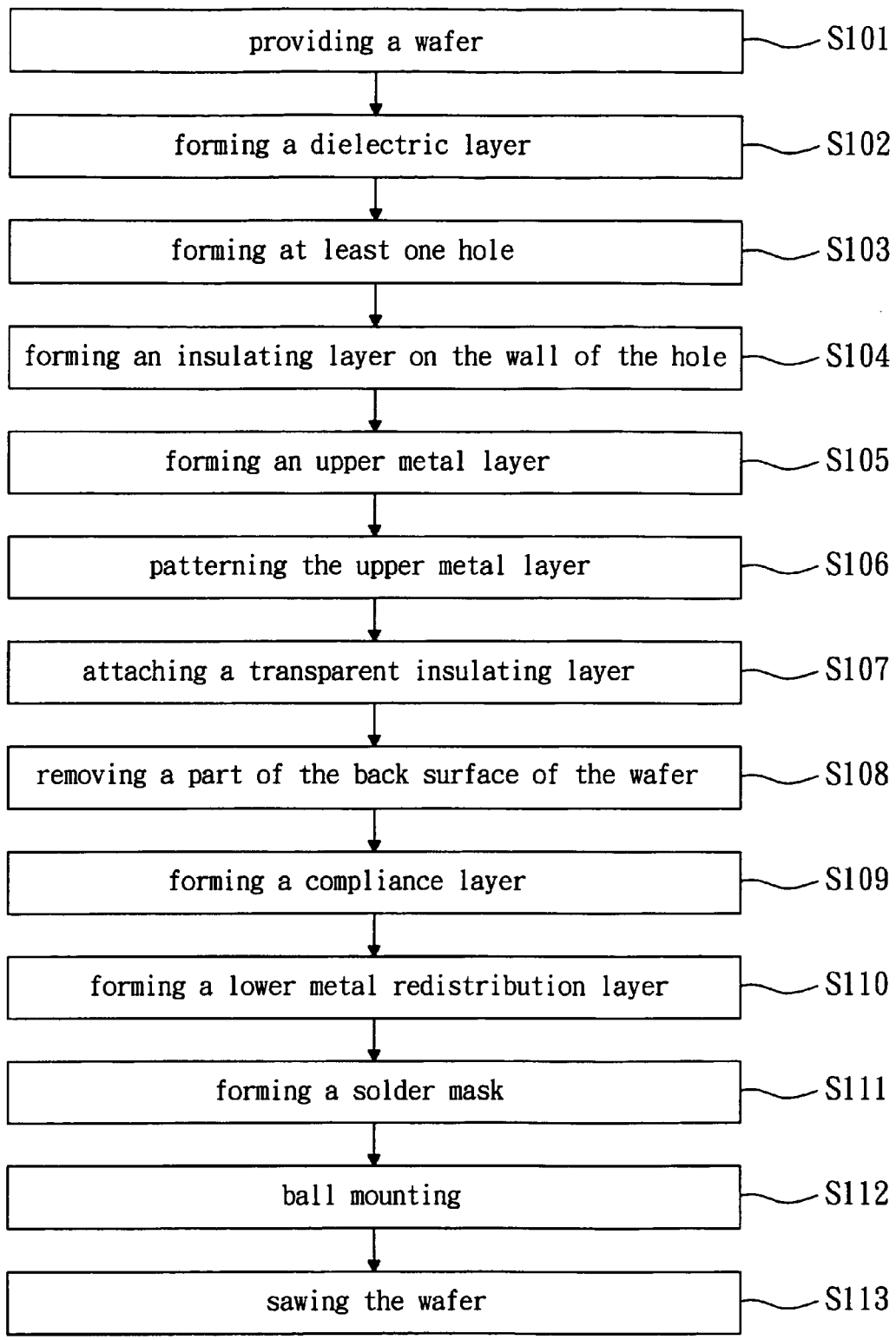
FIG. 5 is a flow chart of the preferred embodiment according to the method of packaging the semiconductor package having an optical device in the invention.

Referring to FIG. 5, the flow chart of the method of packaging the semiconductor package having an optical device according to the preferred embodiment of the present invention is shown. FIGS. 6 to 23 are schematic views corresponding to the steps in FIG. 5.

Firstly, in step S101, a wafer 30 is provided. The wafer 30 has an active surface 301, a back surface 302, and a plurality of sawing lines 305. The active surface 301 has at least one upper pad 304 and an optical device 303 thereon, wherein the optical device 303, for example, a Complementary Metal-Oxide Semiconductor (CMOS), is electrically connected to the upper pad 304. A plurality of chips 306 are defined by the sawing lines 305 as shown in FIG. 6.

Then, in step S102, a dielectric layer 31 is formed on the active surface 301 of the wafer 30, as shown in FIG. 7. The dielectric layer 31 is formed to enable a following metal layer to be formed more easily on the active surface 301 of the wafer 30. Therefore, this step S102 is optional.

Then, in step S103, at least one hole 32 is formed on the active surface 301 of the wafer 30, as shown in FIG. 8. In this embodiment, the hole 32 does not penetrate through the wafer 30, but is located between the sawing line 305 and the upper pad 304. The method to form the hole 32 includes, but is not limited to, laser cutting and dry etching. For the dry etching, the openings corresponding to the holes 32 are firstly formed on the dielectric layer 31, and then the wafer 30 is etched by the $SF_6$ gas. For the laser cutting, a part of the wafer 30 and the dielectric layer 31 is removed directly.

Figure 10:
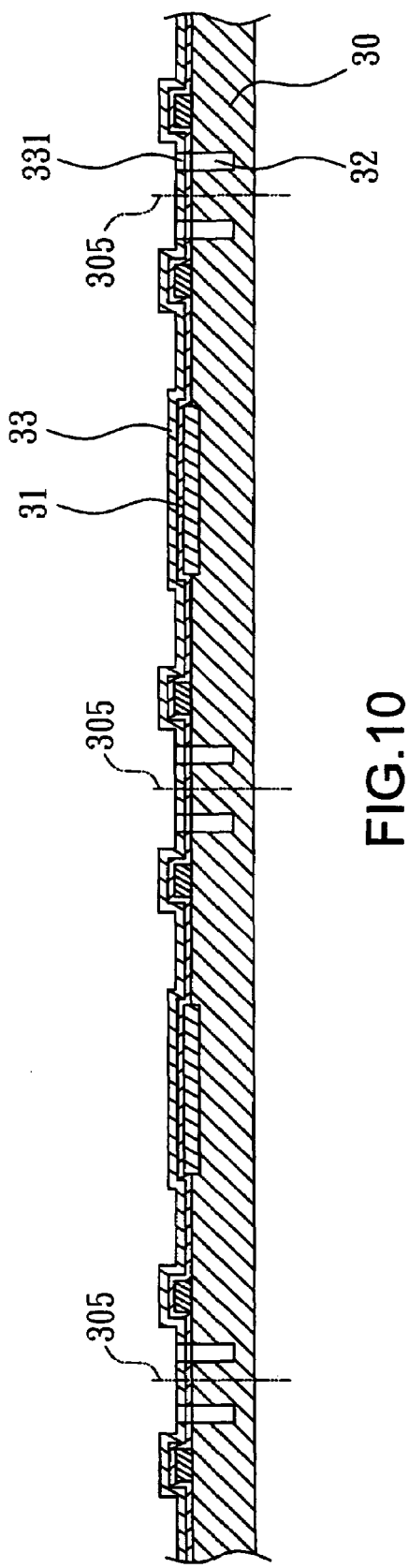
Figure 11:
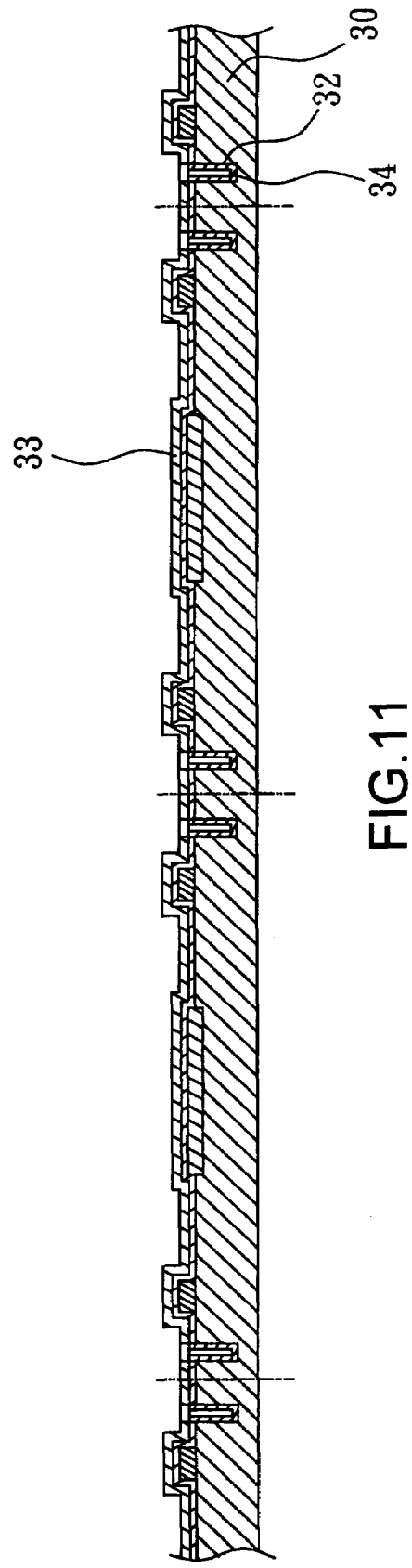

Then, in step S104, an insulating layer 34 is formed on the wall of the hole 32. In this embodiment, the step S104 is accomplished as follows. Firstly, a photoresist layer 33 is formed on the dielectric layer 31, as shown in FIG. 9. Subsequently, at least one opening 331 is formed on the photoresist layer 33, and the opening 331 corresponds to the hole 32, as shown in FIG. 10. In the embodiment, the opening 331 is formed by exposure and development. Then, an insulating layer 34 is formed on the wall of the hole 32, as shown in FIG. 11. In the embodiment, the insulating layer 34 is formed by vapor deposition. Finally, the photoresist layer 33 is removed, as shown in FIG. 12.

Next, in step S105, an upper metal layer 35 is formed on the dielectric layer 31 on the active surface 301 of the wafer 30. If there is no dielectric layer 31, the upper metal layer 35 is formed on the active surface 301 of the wafer 30. The hole 32 is filled with the upper metal layer 35 to form a metal post 36, as shown in FIG. 13. In the embodiment, the step S105 is accomplished as follows. Firstly, a seed layer is formed on the dielectric layer 31 and the wall of the hole 32 by sputtering. Then, the upper metal layer 35 is formed on the seed layer by electroplating, thereby the upper metal layer 35 has achieved a sufficient thickness and the hole 32 is filled with the upper metal layer 35.

Figure 14:
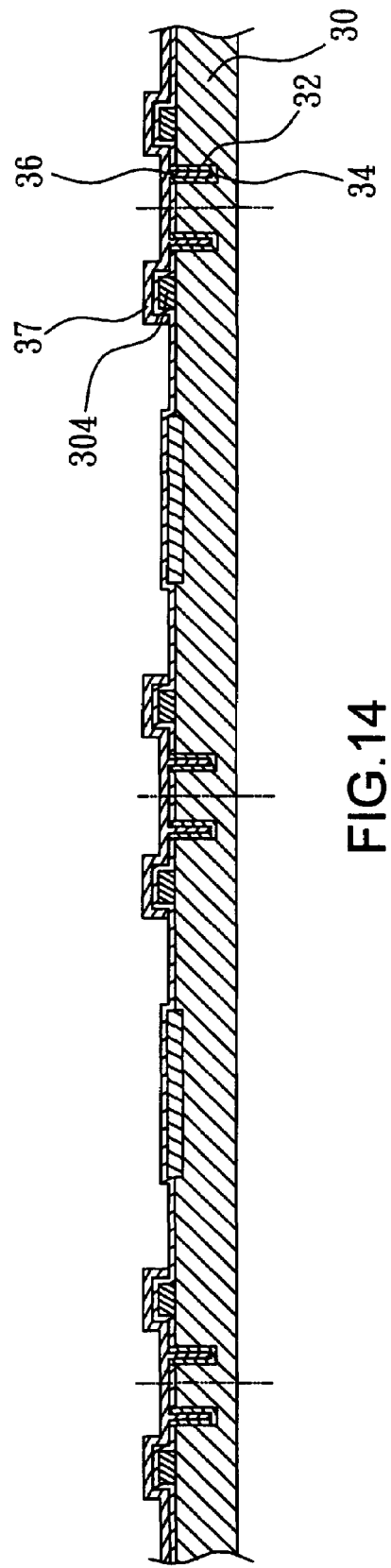

Then, in step S106, the upper metal layer 35 is patterned to form an upper metal redistribution layer (RDL) 37. The upper pad 304 is electrically connected to the metal (i.e., the metal post 36) within the hole 32 through the upper metal redistribution layer 37, as shown in FIG. 14.

Figure 15:
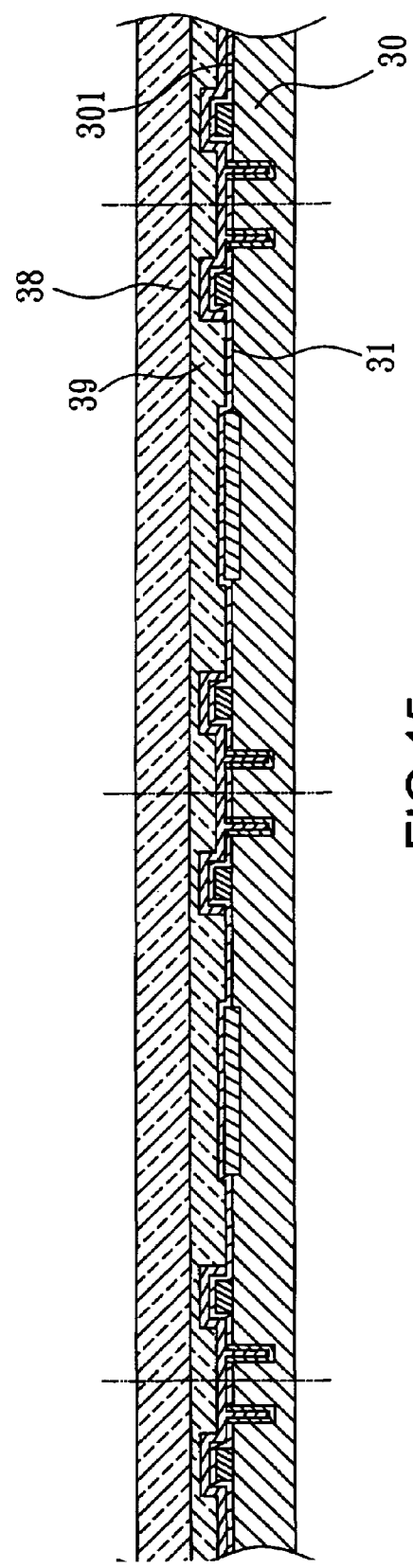

Then, in step S107, a transparent insulating layer 38 (for example, a glass layer) is attached on the dielectric layer 31 on the active surface 301 of the wafer 30 by an adhesive layer 39, as shown in FIG. 15. If there is no dielectric layer 31, the transparent insulating layer 38 is attached onto the active surface 301 of the wafer 30 by the adhesive layer 39.

Then, in step 108, a part of the back surface 302 of the wafer 30 is removed so as to expose the metal (i.e., the metal post 36) within the hole 32 outside the back surface 302 of the wafer 30, as shown in FIG. 16. In the embodiment, the entire back surface 302 of the wafer 30 is ground. Thus, the hole 32 becomes a through hole that penetrates through the wafer 30, and the lower surface of the metal post 36 is exposed outside the back surface 302 of the wafer 30. Moreover, if necessary, a part of the back surface 302 of the wafer 30 is further removed by the means of dry etching, so as to expose the lower end of the metal post 16, as shown in FIG. 17, to facilitate the following process.

Figure 18:
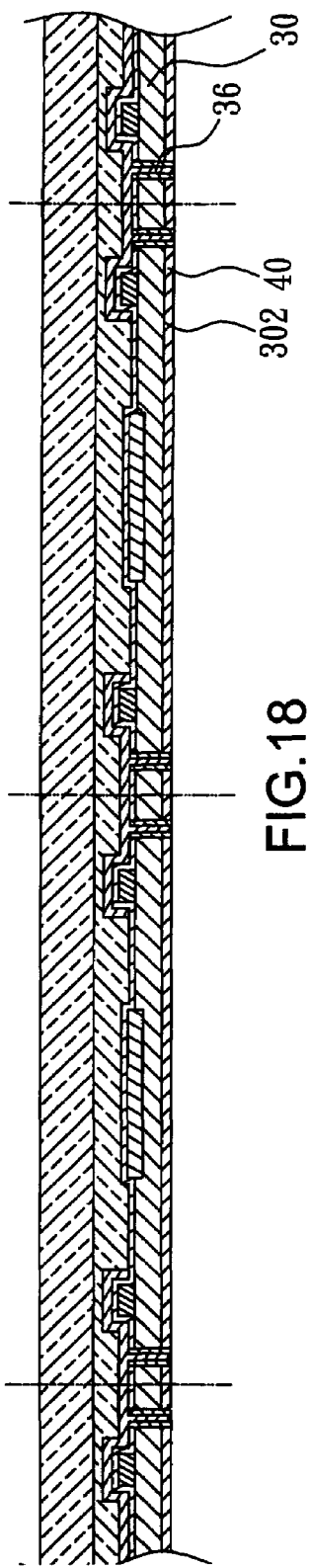

Then, in step S109, a compliance layer 40 is formed on the back surface 302 of the wafer 30, wherein the lower surface of the metal post 36 is not covered by the compliance layer 40, as shown in FIG. 18. It should be noted that the step S109 is optional.

Figure 19:
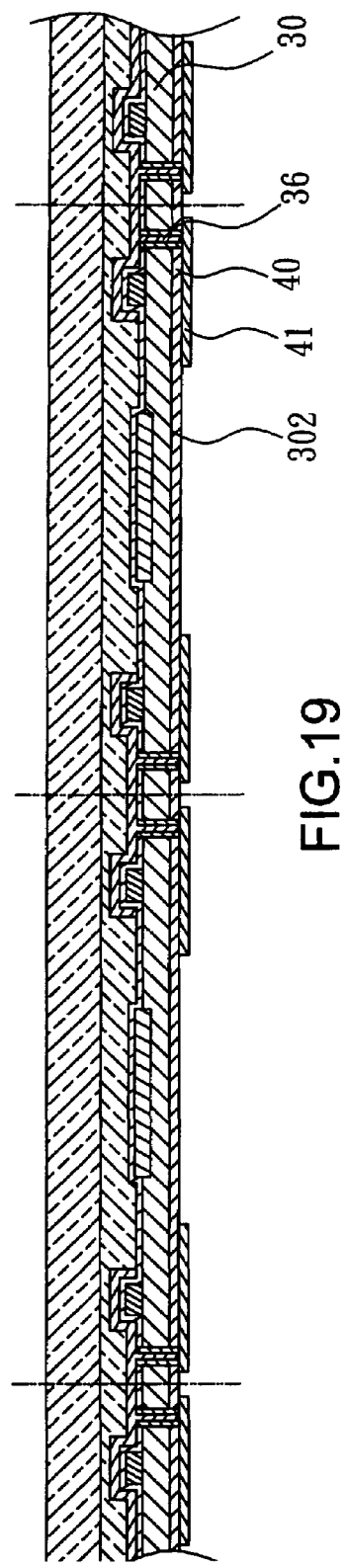

Then, in step S110, a lower metal redistribution layer 41 is formed on the compliance layer 40 on the back surface 302 of the wafer 30, wherein the lower metal redistribution layer 41 is connected to the lower surface of the metal post 36, as shown in FIG. 19. If there is no compliance layer 40, the lower metal redistribution layer 41 is formed on the back surface 302 of the wafer 30.

Figure 20:
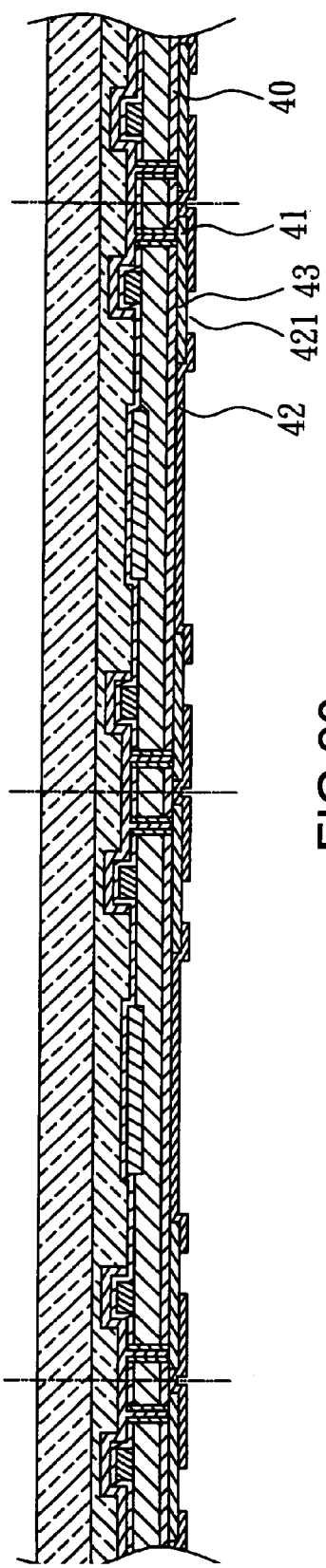

Then, in step S111, a solder mask 42 is formed on the lower metal redistribution layer 41 and the compliance layer 40, as shown in FIG. 20. The solder mask 42 has at least one opening 421. The opening 421 defines the lower pad 43 of the lower metal redistribution layer 41.

Figure 21:
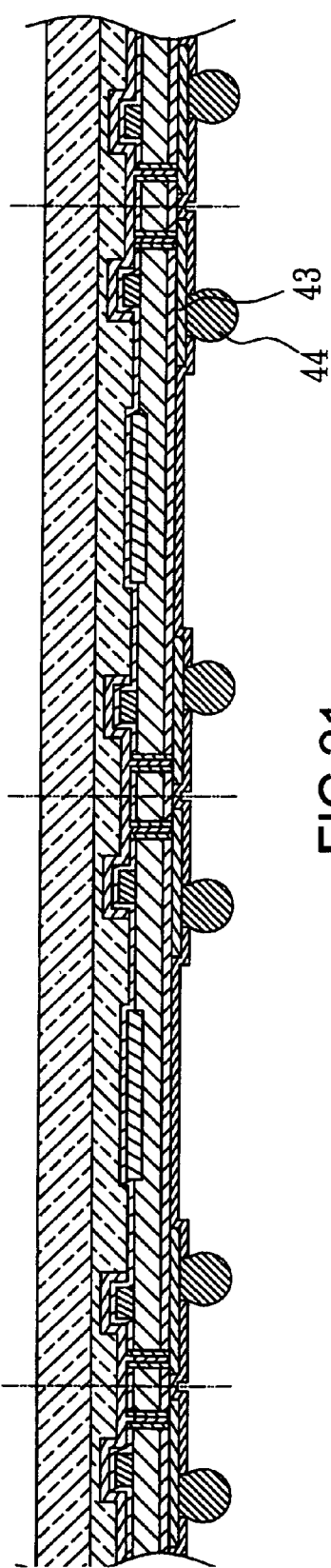

Then, step S112 is a ball mounting process. A plurality of solder balls 44 are formed on the lower pad 43, as shown in FIG. 21. It should be noted that the step S112 is optional.

Figure 22:
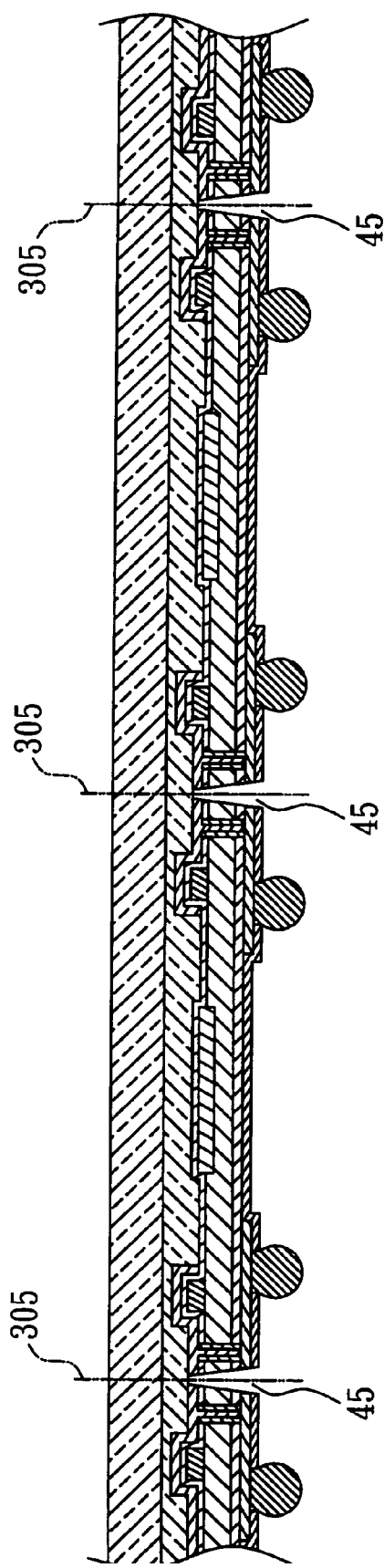

Finally, step S113 is a sawing process. In the embodiment, a notch 45 is formed on the position corresponding to the sawing line 35 of the wafer 30 before sawing, as shown in FIG. 22. After that, the sawing process is carried out to form a plurality of packages 50, as shown in FIG. 23.

Figure 23:
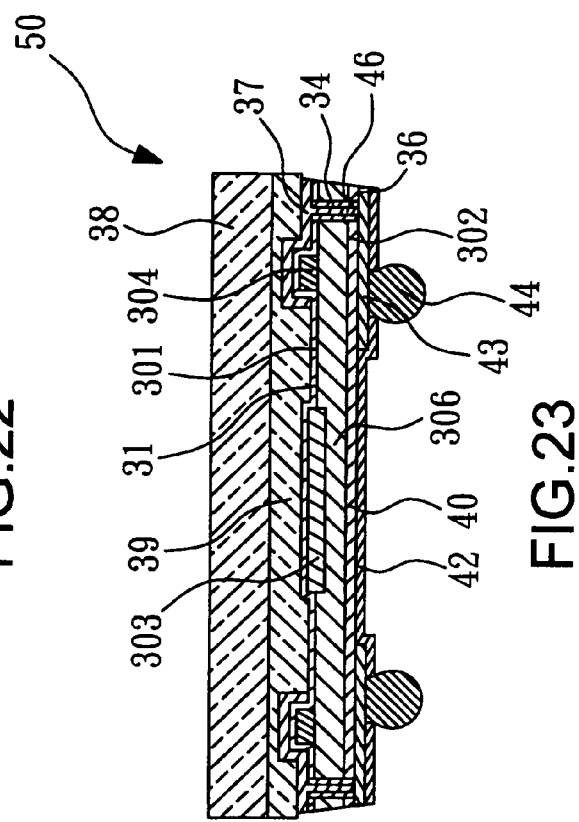

Referring to FIG. 23, according to a preferred embodiment of the present invention, a schematic view of the semiconductor package having an optical device is shown. The semiconductor package 50 of the present invention comprises a chip 306, an upper metal redistribution layer 37, a transparent insulating layer 38, a lower metal redistribution layer 41, a solder mask 42, and at least one solder ball 44.

The chip 306 has an active surface 301, a back surface 302 and at least one through hole 46. The active surface 301 has at least one upper pad 304 and an optical device 303 electrically connected to the upper pad 304. The through hole 46 is filled with a metal post 36, and an insulating layer 34 is disposed between the wall of the through hole 46 and the metal post 36.

The upper metal redistribution layer 37 is disposed on the active surface 301 of the chip 30 and connects the upper pad 304 and the metal post 36. Preferably, a dielectric layer 31 is disposed between the upper metal redistribution layer 37 and the active surface 301 of the wafer 30. The transparent insulating layer 38 (for example, a glass layer) is disposed on the active surface 301 of the wafer 30. Preferably, an adhesive layer 39 is disposed between the transparent insulating layer 38 and the active surface 301. The lower metal redistribution layer 41 is disposed on the back surface 302 of the wafer 30 and electrically connected to the lower surface of the metal post 36. Preferably, a compliance layer 40 is further disposed between the back surface 302 of the wafer 30 and the lower metal redistribution layer 41.

The solder mask 42 is disposed on the lower surface of the compliance layer 40 and the lower metal redistribution layer 41. The solder mask 42 has at least one opening, which defines lower pad 43 of the lower metal redistribution layer 41. The solder balls 44 are disposed on the lower pad 43.

While an embodiment of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method of packaging a semiconductor package having an optical device, comprising:
   (a) providing a wafer having an active surface and a back surface, wherein the active surface has at least one upper pad and an optical device electrically connected to the upper pad;
   (b) forming at least one hole on the active surface of the wafer;
   (c) forming an insulating layer on a wall of the hole;
   (d) forming an upper metal layer on the active surface of the wafer, wherein the hole is filled with the upper metal layer;

(e) patterning the upper metal layer to form an upper metal redistribution layer for electrically connecting the upper pad to the metal in the hole;

(f) attaching a transparent insulating layer on the active surface of the wafer;

(g) removing a part of the back surface of the wafer for exposing the metal in the hole outside the back surface of the wafer;

(h) forming a lower metal redistribution layer on the back surface of the wafer, the lower metal redistribution layer being electrically connected to the metal in the hole; and (i) sawing the wafer to form a plurality of individual semiconductor packages.

2. The method according to claim 1, wherein the wafer further comprises a plurality of sawing lines perpendicular to each other in the step (a) and the hole is disposed between the sawing line and the upper pad in step (b).

3. The method according to claim 1, after the step (a), further comprising:

(a1) forming a dielectric layer on the active surface of the wafer.

4. The method according to claim 1, wherein the hole is formed on the active surface of the wafer by laser cutting in the step (b).

5. The method according to claim 1, wherein the hole is formed on the active surface of the wafer by dry etching in the step (b).

6. The method according to claim 1, wherein the step (c) comprises:

(c1) forming a photoresist layer on the active surface of the wafer;

(c2) forming at least one opening on the photoresist layer, wherein the opening corresponds to the hole;

(c3) forming an insulating layer on the wall of the hole; and (c4) removing the photoresist layer.

7. The method according to claim 6, wherein the opening is formed on the photoresist layer by exposure and development in the step (c2).

8. The method according to claim 6, wherein the insulating layer is formed on the wall of the hole by vapor deposition in the step (c3).

9. The method according to claim 1, wherein the step (d) comprises:

(d1) forming a seed layer on the active surface of the wafer and the wall of the hole; and (d2) forming the upper metal layer on the seed layer, wherein the hole is filled with the upper metal layer.

10. The method according to claim 9, wherein the seed layer is formed by sputtering in the step (d1).

11. The method according to claim 9, wherein the metal layer is formed by electroplating in the step (d2).

12. The method according to claim 1, wherein the step (g) comprises:

(g1) removing a part of the back surface of the wafer to form the hole into a through hole; and (g2) further removing a part of the back surface of the wafer to expose the metal within the hole outside the back surface of the wafer.

13. The method according to claim 12, wherein a part of the back surface of the wafer is removed by grinding in the step (g1).

14. The method according to claim 12, wherein a part of the back surface of the wafer is removed by dry etching in the step (g2).

15. The method according to claim 1, wherein the step (h) comprises:

(h1) forming a compliance layer on the back surface of the wafer, wherein the metal within the hole is not covered by the compliance layer;

(h2) forming a lower metal layer on the compliance layer, wherein the lower metal layer is connected to the metal within the hole; and (h3) patterning the lower metal layer to form the lower metal redistribution layer.

16. The method according to claim 15, after the step (h3), further comprising:

(h4) forming a solder mask on the lower metal redistribution layer; and (h5) forming at least one opening on the solder mask, wherein a lower pad of the lower metal redistribution layer is defined by the opening.

17. The method according to claim 16, after the step (h5), further comprising:

(h6) forming a plurality of solder balls on the lower pad.

18. The method according to claim 1, after the step (h), further comprising a step of forming a solder mask on the lower metal redistribution layer and a step of forming at least one opening on the solder mask, wherein a lower pad of the lower metal redistribution layer is defined by the opening.

* * * * *